United States Patent
Kraxenberger et al.

(10) Patent No.: US 6,593,254 B2
(45) Date of Patent: Jul. 15, 2003

(54) METHOD FOR CLAMPING A SEMICONDUCTOR DEVICE IN A MANUFACTURING PROCESS

(75) Inventors: Manfred Kraxenberger, Ottendorf-Okrilla (DE); Ines Thümmel, Dresden (DE); Bruno Spuler, München (DE); Thorsten Schedel, Dresden (DE); Karl Mautz, Austin, TX (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/112,271

(22) Filed: Mar. 28, 2002

(65) Prior Publication Data

US 2002/0132393 A1 Sep. 19, 2002

Related U.S. Application Data

(63) Continuation of application No. PCT/EP00/09052, filed on Sep. 15, 2000.

(30) Foreign Application Priority Data

Sep. 29, 1999 (EP) .............................. 99119038

(51) Int. Cl.[7] .................. H01L 21/44; H01L 21/48; H01L 21/50
(52) U.S. Cl. ........................ 438/928; 438/106
(58) Field of Search .................. 438/928, 106, 438/700

(56) References Cited

U.S. PATENT DOCUMENTS

| | | | |
|---|---|---|---|
| 4,404,736 A | * | 9/1983 | Koshino et al. ... 148/DIG. 159 |
| 5,382,551 A | | 1/1995 | Thakur et al. |
| 5,599,722 A | | 2/1997 | Sugisaka et al. |
| 5,716,873 A | * | 2/1998 | Prall et al. ................... 438/669 |
| 5,780,311 A | * | 7/1998 | Beasom et al. ...... 148/DIG. 50 |
| 5,783,850 A | | 7/1998 | Liau et al. |
| 5,801,084 A | * | 9/1998 | Beasom et al. ...... 148/DIG. 12 |
| 5,847,463 A | | 12/1998 | Trivedi et al. |
| 5,856,230 A | | 1/1999 | Jang |
| 5,893,760 A | | 4/1999 | Mikata et al. |
| 5,958,796 A | * | 9/1999 | Prall et al. ................... 438/692 |
| 6,080,675 A | * | 6/2000 | Prall et al. ................... 438/694 |

FOREIGN PATENT DOCUMENTS

| | | |
|---|---|---|
| EP | 0 701 276 A2 | 3/1996 |
| JP | 64-29801 | 1/1989 |
| WO | WO 98/33205 | 7/1998 |

* cited by examiner

*Primary Examiner*—John F. Niebling
*Assistant Examiner*—Angel Roman
(74) *Attorney, Agent, or Firm*—Laurence A. Greenberg; Werner H. Stemer; Gregory L. Maybeck

(57) ABSTRACT

There is disclosed a method for clamping a semiconductor wafer, preferably suitable for a wafer with a diameter of 300 mm or larger. After depositing at least one encapsulating material layer over the front side and backside of the wafer, the material layer over the front side of the wafer is etched selectively to form a predetermined structure in following process steps. Wafer warpage is caused as a result of unequal wafer bowing stress of the material layer. By removing the material layer over the backside of the wafer partially or completely in accordance with the desired reduction of the bowing stress wafer warpage is reduced. In a further course of the manufacturing process, the semiconductor device is clamped electrostatically, physically or by use of vacuum.

9 Claims, 6 Drawing Sheets

METHOD FOR CLAMPING A SEMICONDUCTOR DEVICE IN A MANUFACTURING PROCESS

CROSS-REFERENCE TO RELATED APPLICATION

This application is a continuation of copending International Application No. PCT/EP00/09052, filed Sep. 15, 2000, which designated the United States.

BACKGROUND OF THE INVENTION

Field of the Invention

The invention relates to a method for clamping a semiconductor device in a manufacturing process using a wafer with deposited material layers causing wafer bowing stress, wherein in particular the wafer is at least 200 mm in diameter.

In the technical process of manufacturing semiconductor devices from wafers (e.g. disks on the basis of silicon) it is common and necessary to apply a lithographic process frequently in the process. In the lithographic process the overlay performance depends on the wafer conditions. Overlay errors may derive e.g. from applying hot processes or processes like chemical mechanical polishing (CMP) and have negative influences on the overlay performance. The errors usually occur due to residuals visible on the wafer surface after the performance of process steps. They can be divided into linear and non-linear overlay errors, whereby only linear or systematic overlay errors can be corrected by varying machine parameters of the exposure tools such as a stepper by optimization of the stepper parameters.

Non-linear overlay errors, which usually cannot be corrected automatically by the manufacturing tools, cause high rework rates resulting in general in a loss of yield. As some of these errors are not correctable, even the rework may show no success.

Beside the aforementioned effects causing non-linear overlay errors, a new root cause especially came up with the wafer technology using wafers of at least 200 mm in diameter. In process steps where a front side and a backside of the wafer is deposited with at least one material layer having tensile or compressive stress such as nitride, polysilicon or different types of oxides, mechanical stress causes wafer warpage, e.g. as a result of forming a structure over the front side of the wafer by etching parts of the material layer. It has been observed that the scale of warpage increases with a larger diameter of the wafer. Due to a significant misalignment in the lithographic process after, for example, an element isolation process, non-linear overlay errors may occur.

Other problems in manufacturing may arise with processes that use electrostatic chucks or physical clamping rings for holding the wafer during etch or thin film deposition processes. Warped wafers coming into the processes cause robotic wafer handling failures due to vacuum sealing problems or process faults due to a leakage of backside cooling gases on the electrostatic chuck. In diffusion operations, precise loading of the wafers into the boats that are inserted in the furnace are affected by warped wafers resulting in wafer breakage or chipping, damage to the boat, or dropped wafers. Operations such as wet chemical processing that load wafers into holders by vacuum clamping on the wafer backside are also impacted by warped wafers. In CMP operations, warped wafers cause process non-uniformity errors due to the warpage affecting the polishing of the entire wafer surface. Further processes that can be impacted in their performance by wafer warpage are ion implantation processes, mask making or metrology processes.

In U.S. Pat. No. 5,856,230 there is disclosed a method for making a field oxide, by which wafer warpage is minimized when a local oxidation of silicon process is applied to a large wafer. A material layer having a compressive stress and a nitride are laminated over the backside of the wafer, so that the compressive stress of the material layer complementarily interacts with the tensile stress of the nitride. The method contains the steps of depositing an oxide layer and the material layer over the front side and the backside of the wafer in addition to the standard LOCOS-process steps. The effects herein may be an increase of manufacturing costs and an increase of process time.

SUMMARY OF THE INVENTION

It is accordingly an object of the invention to provide a method for clamping a semiconductor device in a manufacturing process which overcomes the above-mentioned disadvantages of the prior art methods of this general type, which reduces or prevents the problems of the aforementioned wafer warpage, the method being applicable to multiple process sequences of semiconductor manufacturing with respect to low costs and process time.

With the foregoing and other objects in view there is provided, in accordance with the invention, a method for clamping a semiconductor device in a manufacturing process. The method includes the steps of providing a wafer having a front side and a backside, depositing at least one encapsulating material layer over the front side and the backside of the wafer, and etching the encapsulating material layer selectively over the front side of the wafer to form a predetermined structure, thereby causing wafer warpage as a result of a bowing stress of the encapsulating material layer. The encapsulating material layer is then removed over the backside of the wafer partially or completely from the backside in accordance with a desired reduction of the bowing stress. The semiconductor device is then clamped electrostatically, physically, or by use of a vacuum in a further course of a manufacturing process for holding the wafer.

The provided method is applicable to a multiple processes containing the aforementioned sequences of process steps. The provided method therefore is applicable, for example, in DRAM technologies and in processes for manufacturing logic circuits or micromechanic components. The effect of reducing wafer warpage can be observed significantly at wafers of at least 200 mm in diameter. Especially when using wafers of 300 mm in diameter and larger, the wafer warpage caused by material layers plays a fairly important role for the performance of the aforementioned processes, in comparison to effects caused by processes such as CMP or hot processes, because of the different thickness-to-area-ratio. Furthermore the problem of overlay distortions caused by wafer warpage can be observed especially at backend of-line lithography processes (BEOL).

In lithographic processes, there is a reduced amount of defocus or non-linear overlay errors as a result of reduced wafer warpage. Thus, process improvements can be observed with no or less rework rates and a reduction in yield loss.

Concerning the other aforementioned processes, as a result of reduced wafer warpage there are no or less robotic wafer handling failures or process faults impacted by wafer warpage. Precise loading of the wafers into boats that are inserted in a furnace is improved. In CMP operations, reduced process non-uniformity errors due to wafer warpage can be achieved.

Further it is not necessary to deposit a novel kind of layer interacting with the stress of the encapsulating material layer. This results in low costs and process time. It takes into account that for several reasons it can be disadvantageous to deposit multiple layers over the backside of the wafer. This could take influence on other processes or prevent the wafer surface from having a flat backside that could be necessary with regard to the requirements of the wafer or stepper chuck.

According to the present invention, the material layer or material layers can be removed completely or partially depending on the process and its requirements according to the reduction of the warpage. In case of removing the layers partially, which helps to destress the wafer, the corresponding process time can be shortened. For partial removal, the layer is removed within a circular area from the backside of the wafer by suitable etching techniques. The layer is still present within the area surrounding the inner circular area.

For example, the material layer or material layers can be formed of nitride, polysilicon or all known variations of oxides such as BPSG or siliconoxide. They all have more or less compressive or tensile stress to cause wafer warpage.

Advantageously, in a lithographic process the invention reduces the necessity of non-linear correction algorithms with respect to reduced software and measurement capacity and therefore reduced process cycle times. It eliminates the root cause with the effect that no compensation of the symptoms is necessary. Over all a better product quality can be achieved.

According to an embodiment of the present invention, the deposition and the removal of the material layer on the backside is part of a common DRAM process forming gate contact interconnects over the front side of the wafer. The wafer is a silicon substrate with active areas at that stage. For forming gate contacts the backside layer may be removed partially or completely according to the desired amount of reduction of bowing stress. The accompanying sequence of process steps is described with respect to the drawings below.

In a preferred embodiment, the material layer or material layers are removed by spin etch processing using an acid process. In a spin etch tool preferably a chemical consisting of HF (e.g. 49% HF at 40° C.) etches the layers on the backside of the wafer. In the aforementioned DRAM process, the process time could be about 360 seconds to remove as much nitride as necessary to reduce the wafer warpage to acceptable levels. To take it off completely it can take about 720 seconds, for example. Thereby it has to be taken into account that the attack on the wafer edge on the front side of the wafer should be minimized.

In a further embodiment of the invention, the wafer bowing stress of the material layer on the backside is relieved by removing the material layer by a plasma back-etching process in a single wafer tool or batch tool with the front side of the wafer protected by a removable protective material. Preferably, the protective material can be formed of a film such as photoresist or other suitable removable film. Advantageously the process uses plasma processing to remove the backside films using chemistries that are known in the art to achieve rapid throughputs. After the processing, the front side protecting film is removed by a solvent, ashing or other cleaning processes.

According to another embodiment, the material layer is removed by a liquid acid processing in an immersion tank in a single wafer tool or a batch tool with the front side of the wafer protected by a removable protective material. Advantageously, the process uses an acid, acids, or other chemical combinations to remove the backside films using chemistries that are known in the art to achieve rapid throughputs. After the processing, the front side protecting film is removed by solvent, ashing or other cleaning processes.

In a further embodiment, the material layer is removed by a vapor phase processing in a single wafer tool or batch tool. Preferably, the process uses an acid vapor, vapor of various acids or other chemical vapor combinations to remove the backside films using chemistries that are known in the art to achieve rapid throughputs. After the processing, the front side protecting film is removed by solvent, ashing or other cleaning processes. In some tool configurations, the front side of the wafer may be adequately protected such that front side protection is not required. Otherwise the front side of the wafer has to be protected by a removable protective material before starting the process.

According to another embodiment, the material layer is removed by CMP processing with the front side of the wafer protected by a removable protecting material. Advantageously, the process uses a slurry or slurry materials, composed of abrasive materials that chemically facilitate the removal by physical methods, that are known in the art to achieve rapid throughputs. After the processing, the front side protecting film is removed by solvent, ashing, physical peel-back of protecting films or other cleaning processes.

In accordance with another mode of the invention, there is the step of forming the encapsulating material layer from nitride.

In accordance with a further mode of the invention, there are the steps of providing the wafer as a silicon substrate with active areas, depositing a gate oxide layer, a polysilicon layer and a metal layer over the front side of the wafer, and performing the step of the depositing of the encapsulating material layer over the front side and the backside of the wafer. The gate oxide layer, the polysilicon layer, the metal layer, and the encapsulating material layer are then etched selectively over the front side of the wafer to form the predetermined structure functioning as gate contact interconnects. An insulating layer is deposited over the gate contact interconnects on the front side of the wafer. An ion implantation process is applied over the front side of the wafer. The encapsulating material layer is partially etched on the backside of the wafer. At least one insulating layer is deposited over the front side of the wafer. A lithographic process is applied over the front side to form a structured mask for assisting in an etching process to form contacts to implanted areas of the silicon substrate.

Other features which are considered as characteristic for the invention are set forth in the appended claims.

Although the invention is illustrated and described herein as embodied in a method for clamping of a semiconductor device in a manufacturing process, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1A:
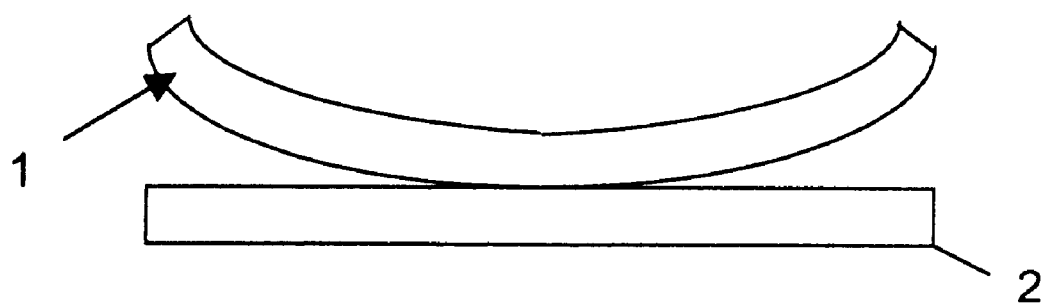
FIG. 1A is a diagrammatic, side-elevational view of a wafer with layers on a back side causing wafer bowing stress according to the invention.

Referring now to the figures of the drawing in detail and first, particularly, to FIG. 1A thereof, there is shown a wafer 1 and a stepper chuck 2, where the wafer 1 is placed upon. Since a front side and a backside of the wafer 1 are deposited with a material layer causing bowing stress, e.g. with a nitride layer, and the material layer is structured over the front side, the bowing stress on the backside is larger than an opposite bowing stress on the front side. The result of the unequal bowing stress is wafer warpage, in the case of FIG. 1A causing the ends of the wafer 1 to lift off the stepper chuck 2. Disadvantageously, defocus of patterns on the wafer surface and non-linear overlay errors could arise when applying a lithographic process to the wafer 1.

Figure 1B:
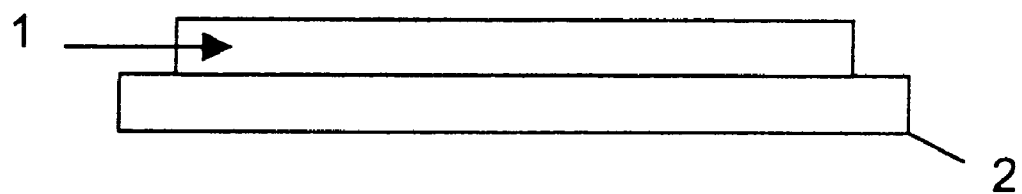
FIG. 1B is a side-elevational view of the wafer after reduction of the wafer bowing stress.

FIG. 1B illustrates the wafer 1 after a reduction of the wafer bowing stress. For example, by etching the material layer over the backside of the wafer 1 partially in accordance with the desired reduction of the bowing stress, wafer warpage of the wafer 1 is reduced. Thus, this results in reduced defocus and non-linear overlay errors in a lithographic process.

Figure 2:
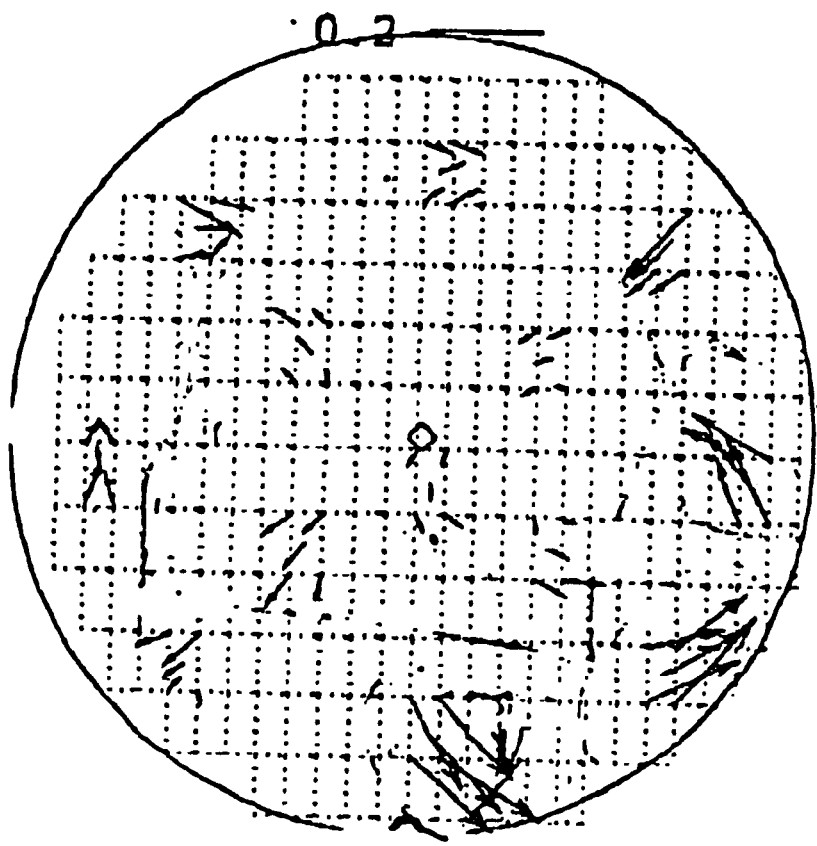
FIG. 2 is a plan view showing residuals as a result of non-linear overlay distortions in a lithographic process.

FIG. 2 shows residuals on the surface of wafer 1 as a result of non-linear overlay distortions in a lithographic process schematically illustrated by small vectors showing the positions of the residuals. The stepper parameters are already optimized to eliminate linear overlay distortions.

FIGS. 3A–3G schematically illustrate a process of making gate contact interconnects on a silicon wafer with active areas. The invention is applicable advantageously to the process. Nevertheless, the invention can also be used in other processes with the problem of wafer warpage in correlation with reduced process performance.

Figure 3A:
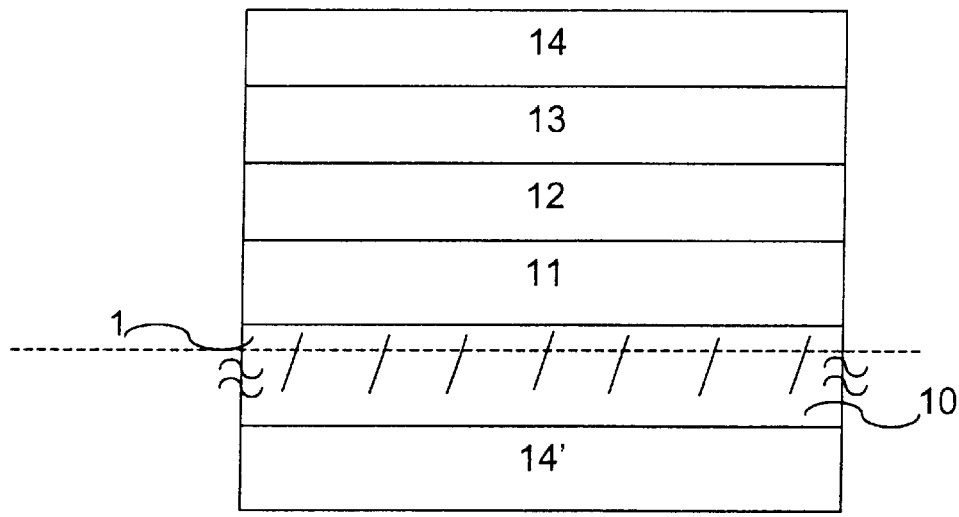
FIGS. 3A–G are cross-sectional views showing a process of making gate contact interconnects on a silicon wafer with active areas according to the invention.

FIG. 3A shows the wafer 1 containing a silicon substrate 10 with active areas. Layers of a gate oxide 11, polysilicon 12, which is doped with phosphorus, and a metal 13, namely tungsten silicon in this case, are deposited on a front side of the silicon substrate 10. For example, the polysilicon layer 12 and the metal layer 13 are deposited by a chemical vapor deposition (CVD) process. Then, typically, in a furnace diffusion process encapsulating material layers 14 and 14', herein formed of a nitride, are deposited over the front side and the backside of the wafer 1, respectively.

Figure 3B:
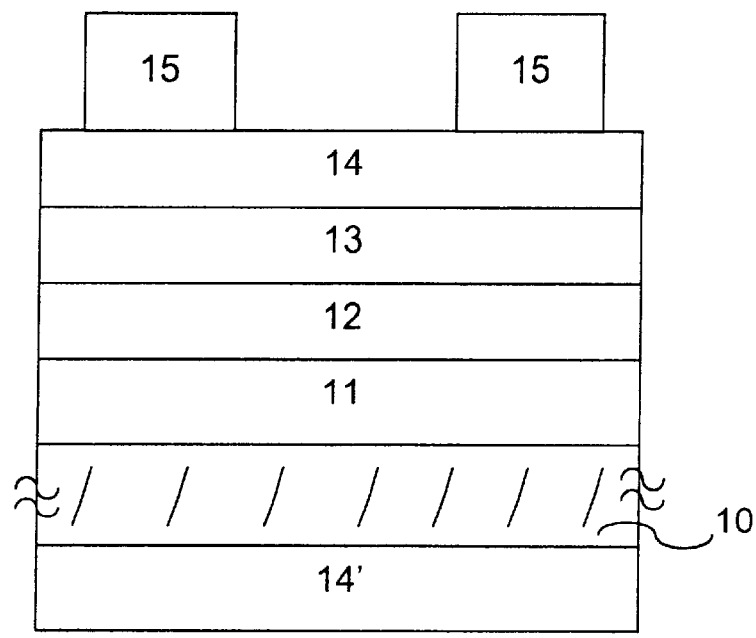

FIG. 3B is a cross section after structures of photoresist 15 have been formed on the nitride layer 14 over the front side in a lithographic process.

Figure 3C:
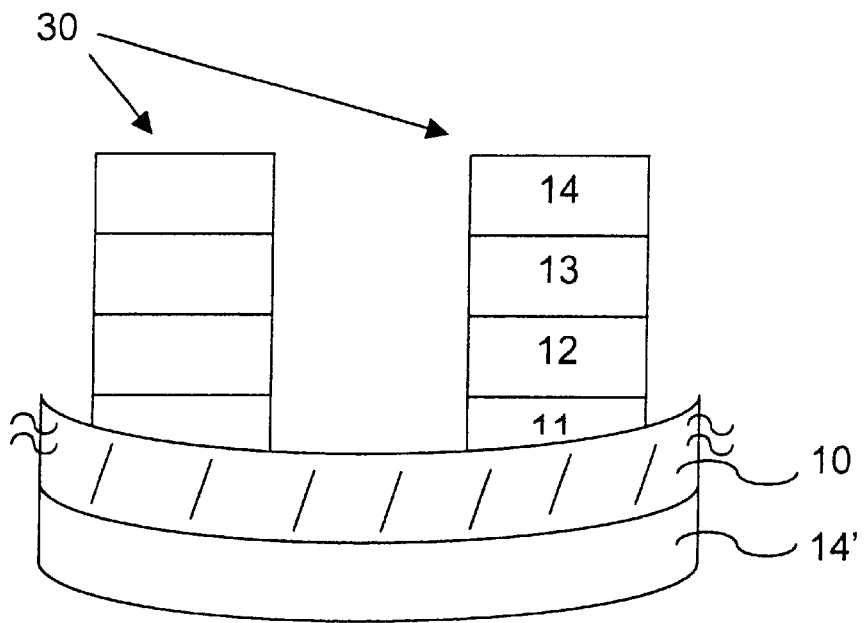

Thereafter, a predetermined structure of gate contact interconnects 30 (GC-interconnects) according to the structure of the photoresist 15 is formed, illustrated in FIG. 3C, by etching the deposited layers. Wafer warpage is caused as a result of unequal wafer bowing stress.

Figure 3D:
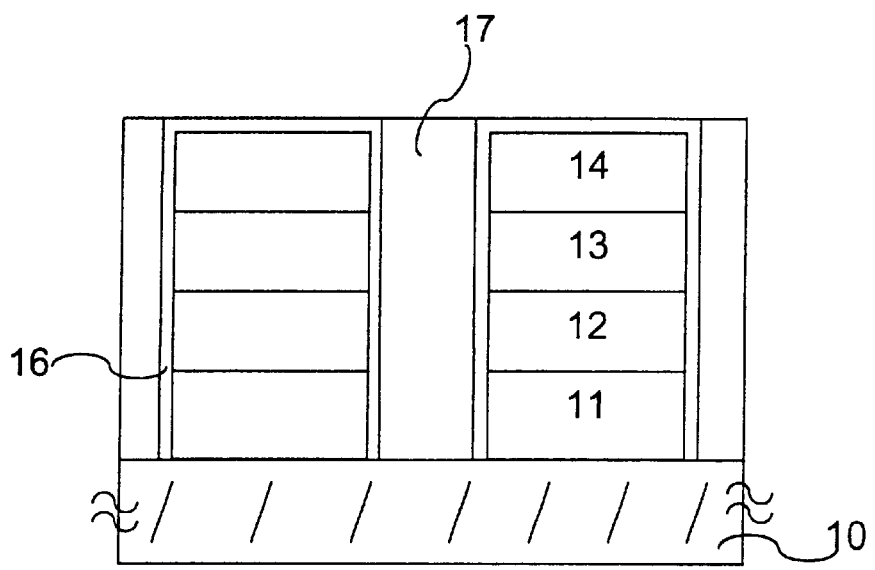
Figure 3E:
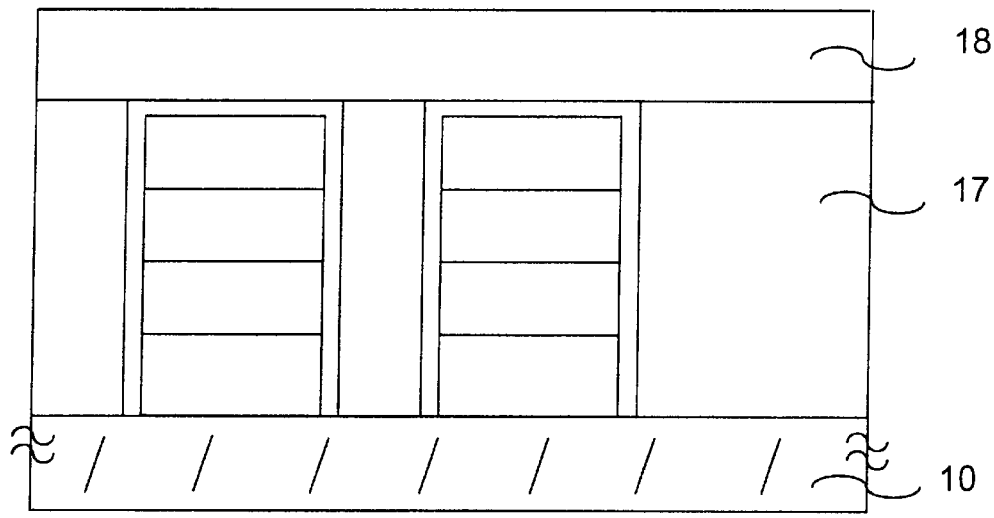

In the following process steps, as shown in FIG. 3D, there is deposited a thin insulating layer 16 such as nitride or oxide on the GC-interconnects 30 over the front side of the wafer 1. Preferably, the insulating layer 16 is for protecting the GC-interconnects 30 in the following various ion-implantation process steps over the front side of the wafer 1.

Thereafter, according to an embodiment of the present invention, the process of backside etching is performed to remove the nitride layer 14' partially. Thereafter, the gaps formed by the structure of the GC-interconnects 30 on the wafer surface are filled with a deposited insulating layer 17 such as oxide. Then, a CMP processing step for planarizing the insulating layer 17 follows.

As shown in FIG. 3E, again an insulating layer 18 such as an oxide is deposited over the front side of wafer 1. Preferably, the insulating layer 18 is formed of another type of oxide as the insulating layer 17 between the aforementioned gaps to perform a selective etch processing of both oxides in one of the following processing steps.

Figure 3F:
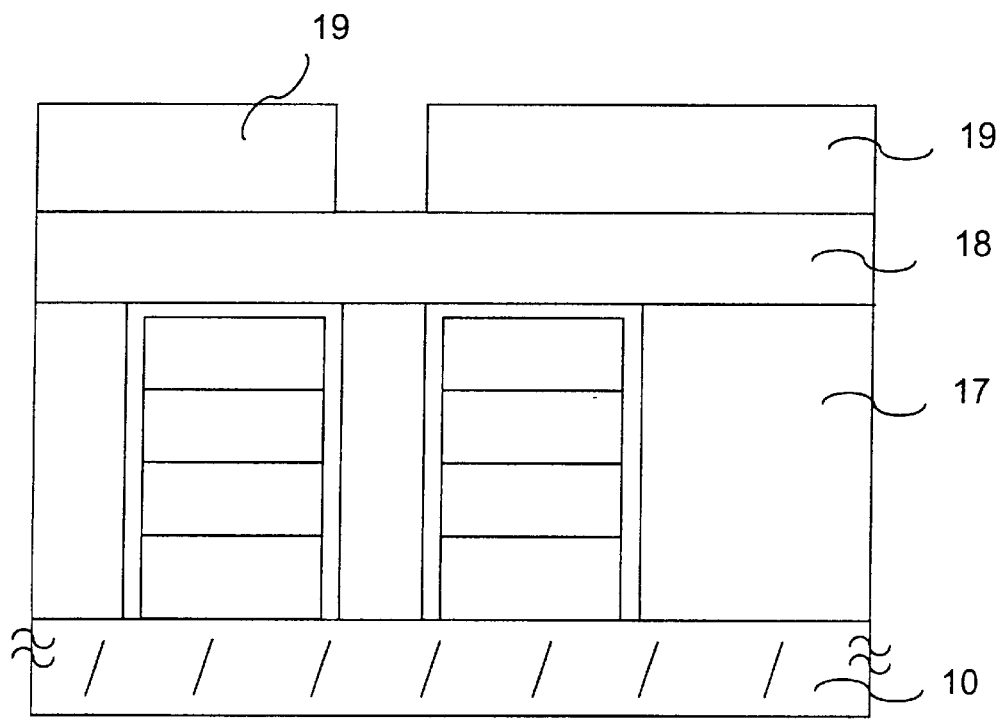

Thereafter, another lithographic process is applied over the front side of the wafer 1 to form a structured mask for the following etch processing, as indicated with photoresists 19 in FIG. 3F. The performance of the lithographic process is improved by the preceeding backside etch processing with the result of reduced wafer warpage. Thereby, several kinds of lithographic processes are applicable such as optical lithography, ion lithography, X-ray lithography or lithography with electron beam.

Figure 3G:
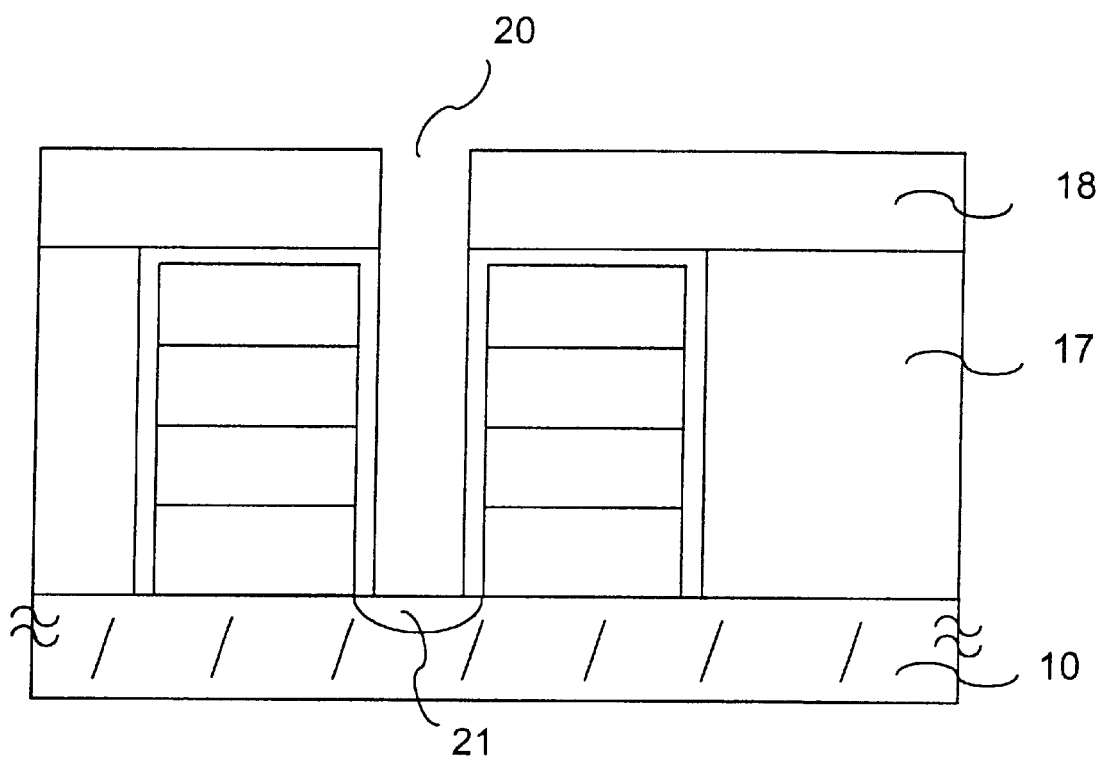

Finally, as shown in FIG. 3G, contacts 20 to implanted areas 21 of the substrate 10 are formed by applying several process steps of etching, measuring and cleaning.

We claim:

1. A method for clamping a semiconductor device in a manufacturing process, which comprises the steps of:
    providing a wafer having a front side and a backside;
    depositing at least one encapsulating material layer over the front side and the backside of the wafer;
    etching the encapsulating material layer selectively over the front side of the wafer to form a predetermined structure, thereby causing wafer warpage as a result of a bowing stress of the encapsulating material layer;
    removing the encapsulating material layer over the back side of the wafer, one of partially and completely from the backside in accordance with a desired reduction of the bowing stress; and
    clamping the semiconductor device by one of electrostatically, physically, and by use of vacuum in a further course of a manufacturing process for holding the wafer.

2. The method according to claim 1, which comprises forming the wafer to have a diameter of at least 300 millimeter.

3. The method according to claim 1, which comprises forming the encapsulating material layer from nitride.

4. The method according to claim 3, which comprises:
    providing the wafer as a silicon substrate with active areas;
    depositing a gate oxide layer, a polysilicon layer and a metal layer over the front side of the wafer;
    performing the step of depositing the encapsulating material layer over the front side and the backside of the wafer;
    etching the gate oxide layer, the polysilicon layer, the metal layer, and the encapsulating material layer selectively over the front side of the wafer to form the predetermined structure functioning as gate contact interconnects;

depositing an insulating layer over the gate contact interconnects on the front side of the wafer;

applying an ion implantation process over the front side of the wafer;

etching, partially, the encapsulating material layer on the backside of the wafer;

depositing at least one insulating layer over the front side of the wafer; and applying a lithographic process over the front side to form a structured mask for assisting in an etching process to form contacts to implanted areas of the silicon substrate.

5. The method according to claim 1, which comprises removing the encapsulating material layer over the backside of the wafer by a spin etching process using an acid process.

6. The method according to claim 1, which comprises removing the encapsulating material layer over the backside of the wafer by a plasma back-etching process in one of a single wafer tool or a batch tool with the front side of the wafer protected by a removable protective material.

7. The method according to claim 1, which comprises removing the encapsulating material layer over the backside of the wafer by liquid acid processing in an immersion tank in a one of a single wafer tool and a batch tool with the front side of the wafer protected by a removable protective material.

8. The method according to claim 1, which comprises removing the encapsulating material layer over the backside of the wafer by vapor phase processing in one of a single wafer tool and a batch tool.

9. The method according to claim 1, which comprises removing the encapsulating material layer over the backside of the wafer by a chemical mechanical polishing process with the front side of the wafer protected by a removable protective material.

* * * * *

UNITED STATES PATENT AND TRADEMARK OFFICE
CERTIFICATE OF CORRECTION

PATENT NO. : 6,593,254 B2  
DATED : July 15, 2003  
INVENTOR(S) : Manfred Kraxenberger et al.

It is certified that error appears in the above-identified patent and that said Letters Patent is hereby corrected as shown below:

<u>Title page,</u>
Item [73], Assignee, should read as follows:
-- Infineon Technolgies SC300 GmbH & Co. KG, Dresden (DE);
  Infineon Technologies AG, München (DE);
  Motorola Inc, Schaumburg, IL (US) --.

Signed and Sealed this

Thirtieth Day of December, 2003

JAMES E. ROGAN
*Director of the United States Patent and Trademark Office*

UNITED STATES PATENT AND TRADEMARK OFFICE
CERTIFICATE OF CORRECTION

PATENT NO.    : 6,593,254 B2
DATED         : June 15, 2003
INVENTOR(S)   : Manfred Kraxenberger et al.

It is certified that error appears in the above-identified patent and that said Letters Patent is hereby corrected as shown below:

Title page,
Item [73], Assignee, should read as follows:
-- Infineon Technologies SC300 GmbH & Co. KG, Dresden (DE);
  Infineon Technologies AG, Müchen (DE);
  Motorola Inc. Schaumburg, IL (US) --.

This certificates supersedes Certificate of Correction issued December 30, 2003.

Signed and Sealed this

Fourteenth Day of March, 2006

JON W. DUDAS
*Director of the United States Patent and Trademark Office*

UNITED STATES PATENT AND TRADEMARK OFFICE
CERTIFICATE OF CORRECTION

PATENT NO. : 6,593,254 B2  
DATED : July 15, 2003  
INVENTOR(S) : Manfred Kraxenberger et al.

It is certified that error appears in the above-identified patent and that said Letters Patent is hereby corrected as shown below:

<u>Title page</u>,
Item [73], Assignee, should read as follows:
-- Infineon Technologies SC300 GmbH & Co. KG, Dresden (DE);
   Infineon Technologies AG, Müchen (DE);
   Motorola Inc. Schaumburg, IL (US) --.

This certificate supersedes Certificate of Correction issued December 30, 2003 and March 14, 2006.

Signed and Sealed this

Thirtieth Day of May, 2006

JON W. DUDAS  
*Director of the United States Patent and Trademark Office*